US012805201B2

(12) United States Patent
Sun et al.

(10) Patent No.: US 12,805,201 B2
(45) Date of Patent: Nov. 17, 2026

(54) MAGNETORESISTIVE STACKS AND METHODS THEREFOR

(71) Applicant: Everspin Technologies, Inc., Chandler, AZ (US)

(72) Inventors: Jijun Sun, Chandler, AZ (US); Jon Slaughter, Albany, NY (US); Renu Whig, Chandler, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 429 days.

(21) Appl. No.: 18/360,564

(22) Filed: Jul. 27, 2023

(65) Prior Publication Data

US 2023/0380297 A1 Nov. 23, 2023

Related U.S. Application Data

(63) Continuation of application No. 16/188,934, filed on Nov. 13, 2018, now Pat. No. 11,758,823.

(60) Provisional application No. 62/591,945, filed on Nov. 29, 2017.

(51) Int. Cl.

| | |
|---|---|
| ***H10N 50/80*** | (2023.01) |
| ***G11C 11/16*** | (2006.01) |
| ***H10B 61/00*** | (2023.01) |
| ***H10N 50/01*** | (2023.01) |
| ***H10N 50/10*** | (2023.01) |
| ***H10N 50/85*** | (2023.01) |

(52) U.S. Cl.

CPC ........... *H10N 50/80* (2023.02); *G11C 11/161* (2013.01); *H10B 61/22* (2023.02); *H10N 50/01* (2023.02); *H10N 50/10* (2023.02); *H10N 50/85* (2023.02)

(58) Field of Classification Search

CPC ........ H10N 50/80; H10N 50/01; H10N 50/85; H10N 50/10; H10B 61/22; G11C 11/161

USPC .......................................................... 257/421

See application file for complete search history.

(56) References Cited

U.S. PATENT DOCUMENTS

| | | | |
|---|---|---|---|
| 5,301,079 | A | 4/1994 | Cain et al. |
| 7,602,033 | B2 | 10/2009 | Zhao et al. |
| 8,582,253 | B1 | 11/2013 | Zheng et al. |
| 8,686,484 | B2 | 4/2014 | Whig et al. |
| 9,136,464 | B1 | 9/2015 | Whig et al. |
| 9,184,375 | B1 | 11/2015 | Tang et al. |
| 9,419,208 | B2 | 8/2016 | Whig et al. |
| 11,264,560 | B2 | 3/2022 | Iwata et al. |

(Continued)

FOREIGN PATENT DOCUMENTS

WO 2017015294 A1 1/2017

OTHER PUBLICATIONS

International Preliminary Report on Patentability and Written Opinion issued in International Application No. PCT/ US2018/060686, issued Feb. 1, 2019 (13 pages).

(Continued)

*Primary Examiner* — Jami Valentine Miller

(74) *Attorney, Agent, or Firm* — Bookoff McAndrews, PLLC

(57) ABSTRACT

A magnetically free region of magnetoresistive device includes at least a first ferromagnetic region and a second ferromagnetic region separated by a non-magnetic insertion region. At least one of the first ferromagnetic region and the second ferromagnetic region may include at least a boron-rich ferromagnetic layer positioned proximate a boron-free ferromagnetic layer.

18 Claims, 6 Drawing Sheets

(56) References Cited

U.S. PATENT DOCUMENTS

| | | | | |
|---|---|---|---|---|
| 11,758,823 | B2 | 9/2023 | Sun et al. | |
| 2003/0021908 | A1 | 1/2003 | Nickel et al. | |
| 2004/0253437 | A1 | 12/2004 | Ingvarsson et al. | |
| 2004/0257719 | A1 | 12/2004 | Ohba et al. | |
| 2005/0184839 | A1 | 8/2005 | Nguyen et al. | |
| 2008/0174921 | A1 | 7/2008 | Ikarashi et al. | |
| 2008/0179699 | A1 | 7/2008 | Horng et al. | |
| 2008/0217710 | A1 | 9/2008 | Horng et al. | |
| 2009/0073737 | A1 | 3/2009 | Klostermann et al. | |
| 2009/0122450 | A1 | 5/2009 | Wang et al. | |
| 2010/0072524 | A1* | 3/2010 | Huai | H01F 10/3254 257/295 |
| 2010/0177449 | A1 | 7/2010 | Zhao et al. | |
| 2011/0318848 | A1 | 12/2011 | Choi et al. | |
| 2013/0230741 | A1 | 9/2013 | Wang et al. | |
| 2016/0005955 | A1* | 1/2016 | Park | H10N 50/01 257/421 |
| 2016/0035970 | A1 | 2/2016 | Tang et al. | |
| 2016/0197265 | A1 | 7/2016 | Tang et al. | |
| 2017/0025602 | A1 | 1/2017 | Liu et al. | |
| 2017/0200884 | A1* | 7/2017 | Oguz | H10N 50/85 |
| 2017/0309813 | A1* | 10/2017 | Naik | H01F 41/32 |
| 2017/0345999 | A1* | 11/2017 | Noh | H01F 41/32 |
| 2018/0026180 | A1* | 1/2018 | Pietambaram | H10N 50/80 257/296 |
| 2019/0165253 | A1 | 5/2019 | Sun et al. | |
| 2019/0228894 | A1 | 7/2019 | Hara et al. | |
| 2022/0149272 | A1 | 5/2022 | Guisan et al. | |

OTHER PUBLICATIONS

Merriam-Webster Online Dictionary definition of "PROXIMATE." No Date.

AHD definition of alloy. No Date.

AHD definition of piecemeal. No Date.

European Search Report issued in EP Application No. 21205243.5 on Feb. 16, 2022 (7 pages).

Merriam-Webster Online Dictionary definition of "other." No Date.

* cited by examiner

MAGNETORESISTIVE STACKS AND METHODS THEREFOR

CROSS-REFERENCE TO RELATED APPLICATIONS

This application is a continuation of U.S. application Ser. No. 16/188,934, filed on Nov. 13, 2018, which claims the benefit of priority from U.S. Provisional Application No. 62/591,945, filed on Nov. 29, 2017, each of which is incorporated by reference herein in its entirety.

TECHNICAL FIELD

The present disclosure relates to, among other things, magnetoresistive stacks and methods for fabricating and using the disclosed magnetoresistive stacks.

INTRODUCTION

There are many inventions described and illustrated herein, as well as many aspects and embodiments of those inventions. In one aspect, the present disclosure relates to a magnetoresistive stack or structure (for example, part of a magnetoresistive memory device, magnetoresistive sensor/transducer device, etc.) and methods of manufacturing the described magnetoresistive stacks. In one embodiment, an exemplary magnetoresistive stack (for example, used in a magnetic tunnel junction (MTJ) magnetoresistive device) of the present disclosure includes one or more layers of magnetic or ferromagnetic material configured to improve the reliability, thermal stability, and/or thermal endurance of the magnetoresistive device.

Briefly, a magnetoresistive stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin transfer torque) by application of a write signal (e.g., one or more current pulses) through the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetic state of the magnetoresistive memory stack is determined or read based on the resistance of the stack in response to a read current (IR).

In some applications, a device incorporating a magnetoresistive stack (such as, for example, an MTJ device such as an MRAM) may be subject to high temperatures (during, e.g., fabrication, testing, operation, etc.). It is known that a strong perpendicular magnetic anisotropy (PMA) of the magnetoresistive stack is desirable for high temperature data retention capabilities of the device. For improved high temperature performance of the device, it is desirable to have a "free" magnetic region with high enough PMA and magnetic moment to enable the device to have a high energy barrier to thermal reversal at elevated temperatures (for example, at 260° C., the typical temperature for soldering of packaged devices onto printed circuit boards (PCBs)), and also have reasonable switching voltage or current in the operating temperature range so that the device will have useful cycling endurance characteristics (for example, at least 10,000 cycles, or preferably more than 1 million, and more preferably over 108 cycles). The disclosed magnetoresistive stacks may have some or all of these desired characteristics. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well defined boundaries with straight edges. However, a person skilled in the art would recognize that, in reality, the different layers typically have a non-uniform thickness. And, at the interface between adjacent layers, the materials of these layers alloy together, or migrate into one or the other material, making their boundaries ill defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)). For example, a "fixed" magnetic region may be formed on or above a "free" magnetic region or layer, which in turn may be formed on or above an insertion layer of the present disclosure.

Figure 1:
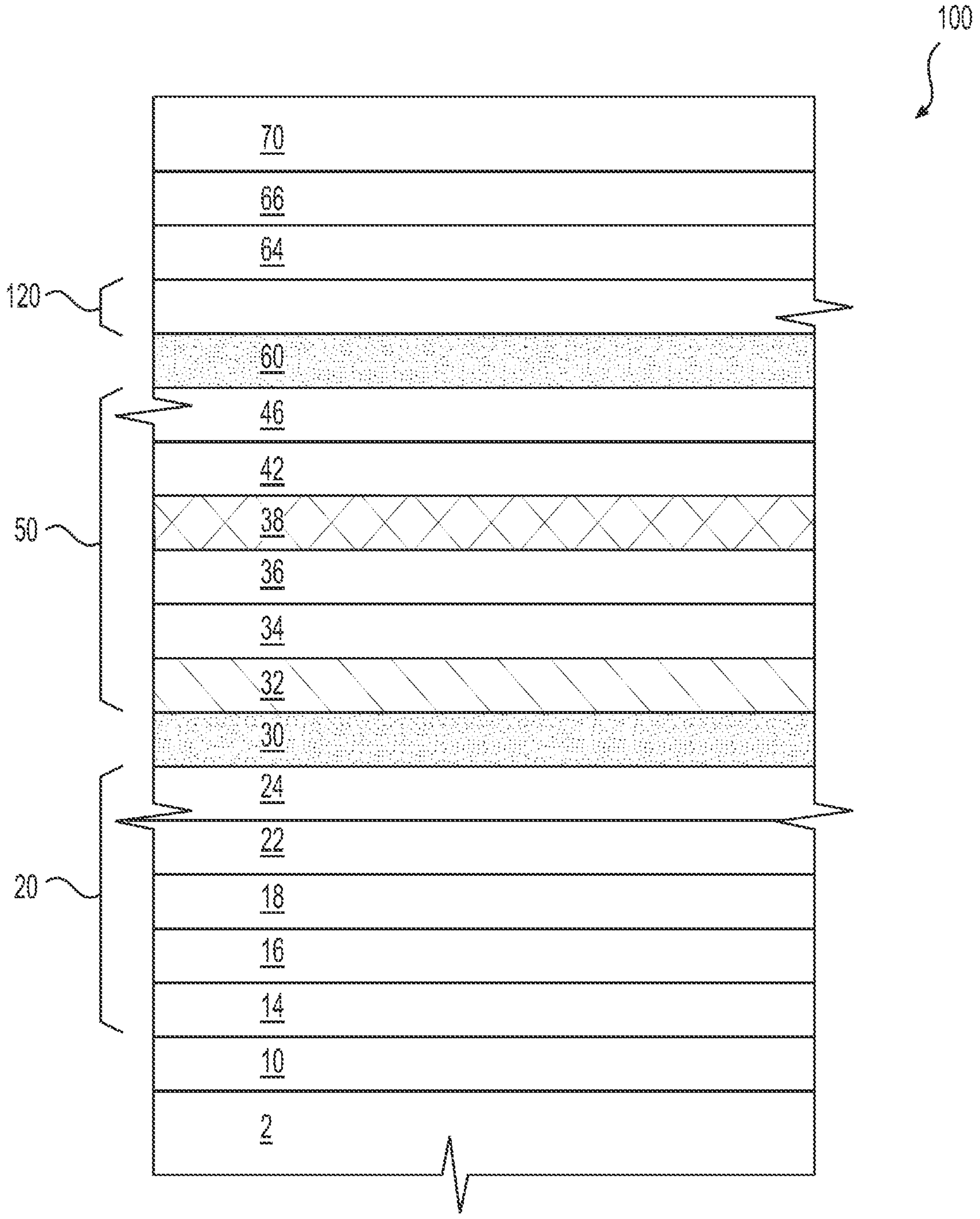
Figure 3A:
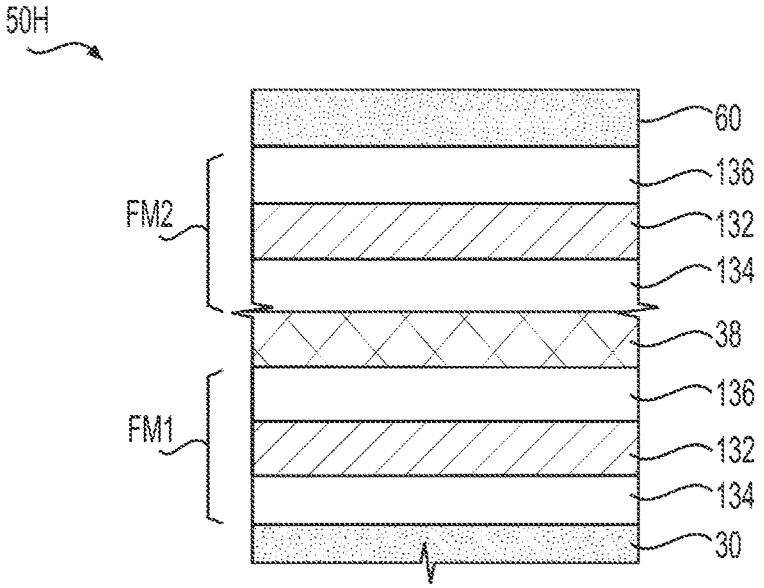
Figure 3B:
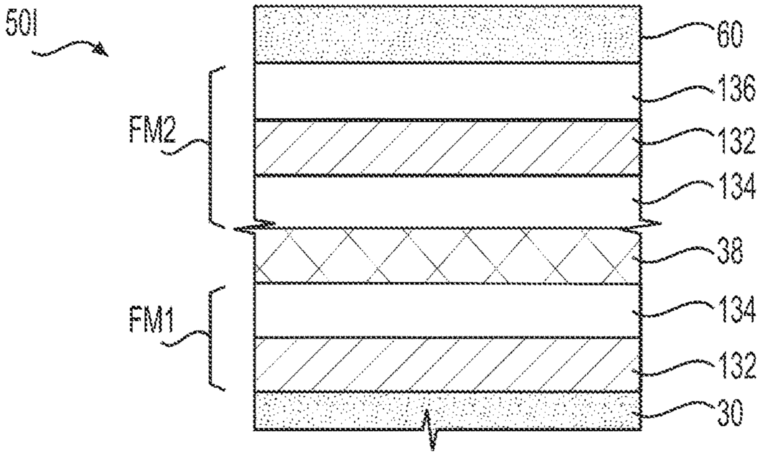
Figure 3C:
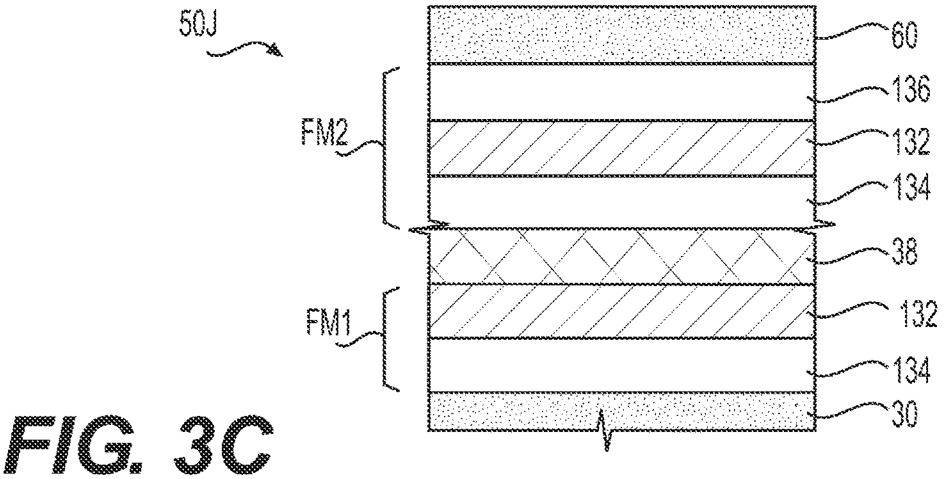
Figure 4:
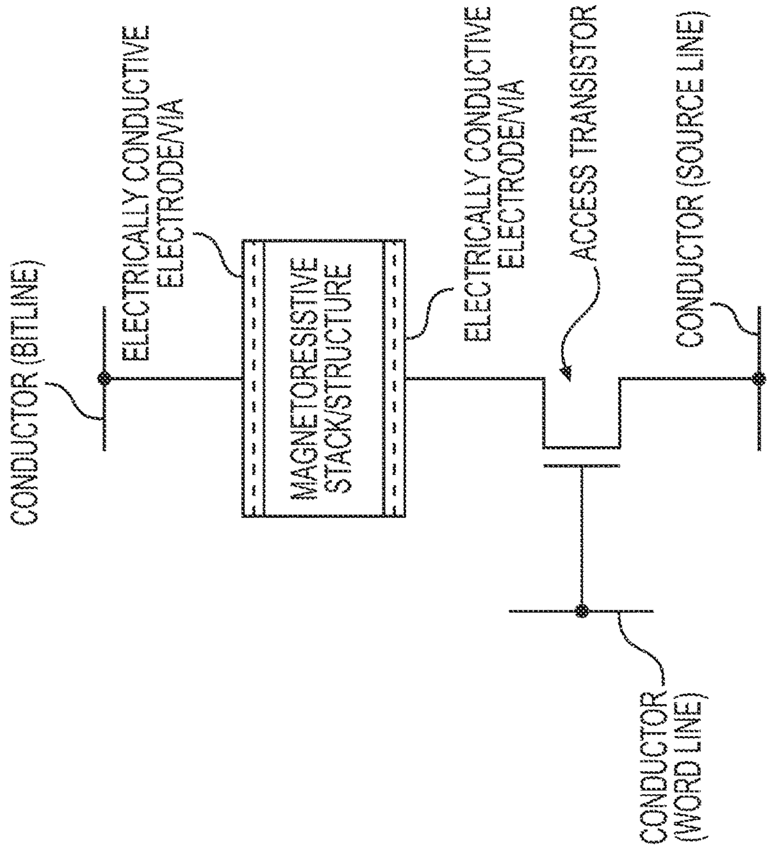
Figure 5A:
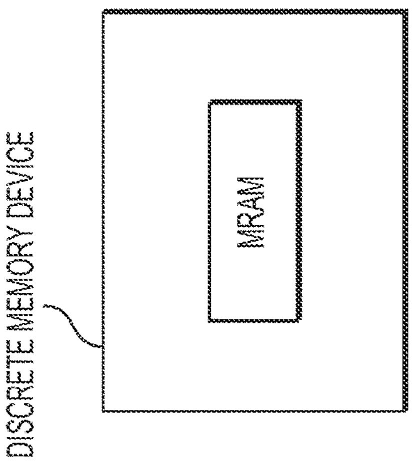
Figure 5B:
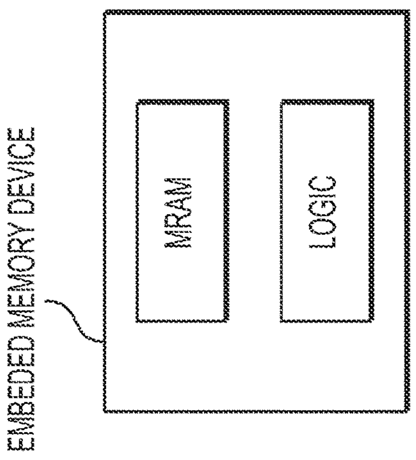
Figure 6:
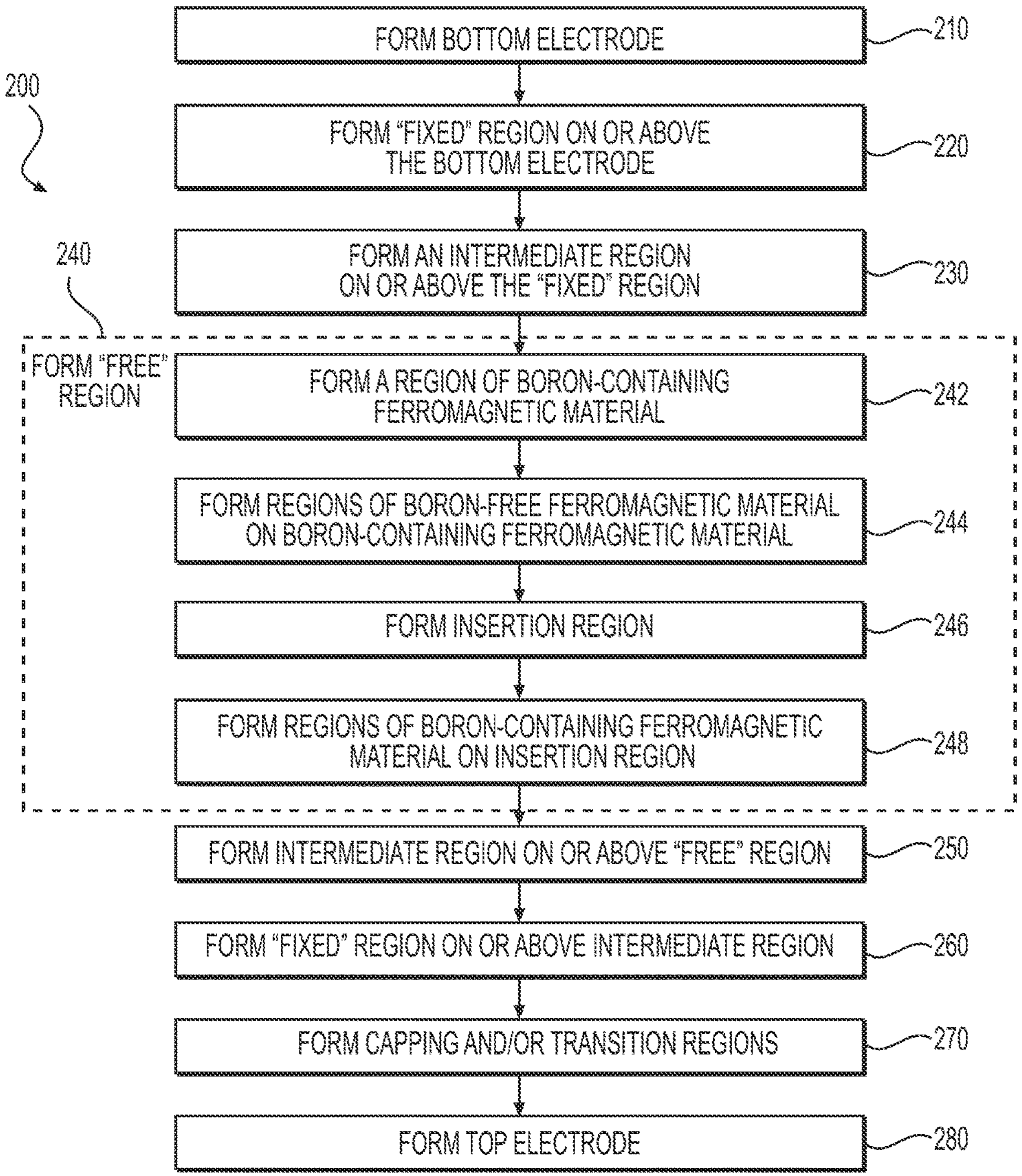

FIG. 1 illustrates a cross-sectional view depicting various regions of an exemplary magnetoresistive stack;

FIGS. 2A-2G illustrate cross-sectional views of exemplary "free" magnetic regions of the exemplary magnetoresistive stack of FIG. 1;

FIGS. 3A-3C illustrate cross-sectional views of other exemplary "free" magnetic regions of the exemplary magnetoresistive stack of FIG. 1;

FIG. 4 is an schematic diagram of an exemplary magnetoresistive memory stack/structure electrically connected to an access transistor in a magnetoresistive memory cell configuration;

FIGS. 5A-5B are schematic block diagrams of integrated circuits including a discrete memory device and an embedded memory device, each including an MRAM (which, in one embodiment is representative of one or more arrays of MRAM having a plurality of magnetoresistive memory stacks according to aspects of certain embodiments of the present disclosure); and FIG. 6 is a simplified exemplary manufacturing flow for the fabrication of the exemplary magnetoresistive stack of FIG. 1.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%. It should be noted that, unless otherwise indicated, all the alloy compositions discussed in this disclosure are in atomic percent.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In one exemplary aspect, the magnetoresistive stack of the present disclosure may be implemented as a spin-torque magnetoresistive random access memory ("MRAM") element ("memory element"). In such aspects, the magnetoresistive stack may include an intermediate region positioned (or sandwiched) between two ferromagnetic regions to form a magnetic tunnel junction (MTJ) device or an MTJ-type device. The intermediate region may be a tunnel barrier and include an insulating material, such as, e.g., a dielectric material. In other embodiments, the intermediate region may be a conductive material, e.g., copper, gold, or alloys thereof. In these other embodiments, where the magnetoresistive stack includes a conductive material in between two ferromagnetic regions, the magnetoresistive stack may form a giant magnetoresistance (GMR) or GMR-type device.

Of the two ferromagnetic regions disposed on either side of the intermediate region, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector does not move substantially in response to such applied magnetic fields or spin-polarized currents. As is known in the art, an electrical resistance of the described magnetoresistive stack may change based on whether the magnetization direction (e.g., the direction of the magnetic moment) of the "free" region adjacent to the non-magnetic layer is in a parallel alignment or in an antiparallel alignment with the magnetization direction (e.g., the direction of the magnetic moment) of the "fixed" region adjacent to the non-magnetic layer. Typically, if the two regions have the same magnetization alignment, the resulting low resistance is considered as a digital "0," while if the alignment is antiparallel the resulting higher resistance is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack may be accomplished by driving a tunneling current pulse through the magnetoresistive stack. The polarity of the current pulse determines the final magnetization state (i.e., parallel or antiparallel) of the "free" region. The mean current required to switch the magnetic state of the "free" region may be referred to as the critical current (Ic). The critical current is indicative of the current required to "write" data in (or the write current of) a magnetoresistive memory cell. Reducing the required write current(s) is desirable so that, among other things, a smaller access transistor can be used for each memory cell and a higher density, lower cost memory can be produced. Reduced write current requirements may also lead to greater longevity of a magnetoresistive memory cell.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) regions which, after further processing (for example, etching) form a magnetoresistive stack.

The disclosed magnetoresistive stacks may be formed between a top electrode/via/line and a bottom electrode/via/line and, which permit access to the stack by allowing for connectivity (for example, electrical) to circuitry and other elements of the magnetoresistive device. Between the electrodes/vias/lines are multiple regions, including at least one "fixed" magnetic region (referred to hereinafter as a "fixed" region) and at least one "free" magnetic region (referred to hereinafter as a "free" region) with one or more intermediate region(s), such as, e.g., a dielectric layer (that form(s) a tunnel barrier) between the "fixed" and "free" magnetic regions. Each of the "fixed" and "free" magnetic regions may include, among other things, a plurality of ferromagnetic layers. In some embodiments, the top electrode (and/or the bottom electrode) may be eliminated, and the bit line may be formed on top of the stack.

FIG. 1 is a cross-sectional view of the regions of an exemplary magnetoresistive stack 100 of the current disclosure. Magnetoresistive stack 100 may include, for example, an in-plane or out-of-plane magnetic anisotropy magnetoresistive stack (e.g., a perpendicular magnetic anisotropy magnetoresistive stack). As illustrated in FIG. 1, magnetoresistive stack 100 includes multiple regions (or layers) arranged one over the other to form a stack of regions between a first electrode 10 (e.g., a top electrode) and a second electrode 70 (e.g., a bottom electrode). When implemented as an MTJ or MTJ-like memory device, the magnetoresistive stack 100 of FIG. 1 may represent a dual spin filter structure (or a double MTJ structure) where a "free" region 50 is formed between two "fixed" regions 20 and 120. It should be noted that depiction of the magnetoresistive stack 100 as having a dual spin filter structure (in FIG. 1) is merely exemplary and not a requirement of the current disclosure. That is, the current disclosure also is applicable to magnetoresistive stacks having a different structure (e.g., a single MTJ structure where a "free" region 50 is formed over a single "fixed" region 20). It will be recognized that several other commonly-used regions or layers of stack 100 (e.g., various protective cap layers, seed layers, underlying substrate, etc.) have not been illustrated in FIG. 1 (and in subsequent figures) for clarity. The different regions of the multi-layer magnetoresistive stack 100 of FIG. 1 will be described below.

As shown in FIG. 1, the first electrode 10 may be a "bottom" electrode, and the second electrode 70 may be a "top" electrode. However, those of ordinary skill in the art will recognize that the relative order of the various regions (or layers) of magnetoresistive stack 100 may be reversed. Further, in some embodiments, the top electrode (and/or the bottom electrode) may be eliminated, and the bit line may be formed on top of the stack. The bottom and top electrodes 10, 70 may comprise an electrically conductive material, and may be part of (or be in physical contact with) electrically conductive interconnects (e.g., vias, traces, lines, etc.) of a device (e.g., MRAM) formed using the magnetoresistive stack 100. Although any electrically conductive material may be used for bottom and top electrodes 10, 70, in some embodiments, a metal such as tantalum (Ta), titanium (Ti), tungsten (W), or a composite or alloy of these elements (e.g., tantalum-nitride alloy) may be used.

Bottom electrode 10 may be formed on a planar surface of a semiconductor substrate 2 (e.g., surface of a semiconductor substrate having electrical circuits (e.g., CMOS circuits) formed thereon, etc.). Although not illustrated in FIG. 1, in some embodiments, electrode 10 may include a seed layer at its interface with the overlying region (e.g., region 20). During fabrication, the seed layer may assist in the formation of the overlying region on electrode 10. The seed layer may include one or more of nickel (Ni), chromium (Cr), cobalt (Co), iron (Fe), and alloys thereof (for example, an alloy including nickel and/or chromium). In some embodiments, the seed layer may be eliminated, and the top surface of electrode 10 itself may act as the seed layer.

With continuing reference to FIG. 1, a "fixed" region 20 may be formed on (or above) the bottom electrode 10. As explained previously, "fixed" region 20 may serve as a "fixed" magnetic region of magnetoresistive stack 100. That is, a magnetic moment vector in the "fixed" region 20 does not move significantly in response to applied magnetic fields (e.g., an external field) or applied currents used to switch the magnetic moment vector of a "free" region 50 of the magnetoresistive stack 100. It should be noted that the structure of the "fixed" region 20 illustrated in FIG. 1 is only exemplary. As known to those of ordinary skill in the art, many other configurations of the "fixed" region 20 also are possible. In general, the "fixed" region 20 may include a single layer or multiple layers stacked one on top of another. The layers of "fixed" region 20 may include alloys that include cobalt and iron and other materials (preferably cobalt, iron, and boron). Typically, the composition of materials (e.g., cobalt, iron, and boron) in the "fixed" region 20 may be selected to achieve good temperature compensation. For the sake of clarity, only certain layers of "fixed" region 20 (and regions on either side of "fixed" region 20) are illustrated in FIG. 1. Those of ordinary skill in the art will readily recognize that the "fixed" region 20 may include one or more additional layers.

In one embodiment, "fixed" region 20 may be a fixed, unpinned synthetic antiferromagnetic (SAF) region disposed on or above electrode 10. The fixed, unpinned synthetic antiferromagnetic (SAF) region may include at least two magnetic regions (i.e., made of one or more layers) 14, 18 (e.g., ferromagnetic layer 1 and ferromagnetic layer 2) separated by a coupling region 16. The one or more of magnetic regions 14, 18 may include one or more of the ferromagnetic elements nickel, iron, and cobalt, including alloys or engineered materials with one or more of the elements palladium (Pd), platinum (Pt), chromium, and alloys thereof. The coupling region 16 may be an antiferromagnetic (AF) coupling region that includes non-ferromagnetic materials such as, for example, iridium (Jr), ruthenium (Ru), rhenium (Re), or rhodium (Rh). In some embodiments, one or both regions 14, 18 may comprise a magnetic multi-layer structure that includes a plurality of layers of (i) a first ferromagnetic material (e.g., cobalt) and (ii) a second ferromagnetic material (e.g., nickel) or a paramagnetic material (e.g., platinum). In some embodiments, regions 14, 18 may also include, for example, alloys or engineered materials with one or more of palladium, platinum, magnesium (Mg), manganese (Mn), and chromium. Additionally, or alternatively, in some embodiments, the "fixed" region 20 may include one or more synthetic ferromagnetic structures (SyF). Since SyFs are known to those skilled in the art, they are not described in greater detail herein. In some embodiments, the "fixed" region 20 may have a thickness in the range of between approximately 8 Å and approximately 300 Å, between approximately 15 Å and approximately 110 Å, greater than or equal to 8 Å, greater than or equal to 15 Å, less than or equal to 300 Å, or less than or equal to no A.

In some embodiments, the "fixed" region 20 may also include one or more additional layers, such as, for example, a transition region 22 and a reference region 24, disposed at the interface between the magnetic region 18 and an overlying region (e.g., region 30, which as will be explained later may include a dielectric material in an MTJ structure). The reference and/or transition regions may include one or more layers of material that, among other things, facilitate/improve growth of the overlying region 30 during fabrication of stack 100. In one embodiment, the reference region 24 may comprise one or more (e.g., all) of cobalt, iron, and boron (for example, in an alloy—such as an amorphous alloy (e.g., CoFeB or CoFeBTa or CoFeTa)), and the transition region 22 may include a non-ferromagnetic transition metal such as tantalum (Ta), titanium (Ti), tungsten (W), ruthenium, niobium (Nb), zirconium (Zr), and/or molybdenum (Mo).

In general, the transition region 22 and the reference region 24 may have any thickness. In some embodiments, a thickness (t) of the reference region 24 may be between approximately 6-13 Å, preferably approximately 8-12 Å, and more preferably approximately 9-9.5 Å, and the thickness of the transition region 22 may be between approximately 1-8 Å, preferably approximately 1.5-5 Å, and more preferably approximately 2.5-3.5 Å. It should be noted that, in some embodiments of magnetoresistive stacks 100, both transition region 22 and reference region 24 may be provided in the "fixed" region 20. In some embodiments, the transition region 22 or both of the transition region 22 and the reference region 24 may be eliminated altogether from magnetoresistive stack 100. And, in some embodiments, only the reference region 24 may be provided in the "fixed" region 20.

"Fixed" region 20 may be deposited or formed using any technique now known or later developed, all of which are intended to fall within the scope of the present disclosure. In some embodiments, one or more of the magnetic regions of the "fixed" region 20 (e.g., regions 14, 18) may be deposited using a "heavy" inert gas (for example, xenon (Xe)), for example, at room temperature (for example, 15-40° C., and more preferably 20-30° C., and most preferably 25° C. (+/−10%)) or a conventional/typical elevated temperature. In some embodiments, the AF coupling region 16 may also be deposited using a "heavy" inert gas (for example, xenon (Xe), argon (Ar), and/or krypton (Kr)) at such temperatures. In embodiments where the transition region 22 and/or the reference region 24 are provided, they may also be deposited using a "heavy" inert gas (for example, xenon (Xe), argon (Ar), and/or krypton (Kr)) at about room temperature (for example, approximately 15-40° C., and more preferably 20-30° C., and most preferably 25° C. (+/−10%)) or an elevated temperature (e.g., approximately 40-60° C.).

The various regions or layers of "fixed" region 20 depicted in FIG. 1 may be deposited individually during a fabrication process. However, as would be recognized by those of ordinary skill in the art, in some embodiments, the materials that make up the various depicted regions may alloy with (intermix with, diffuse into, etc.) the materials of adjacent regions during a subsequent processing (e.g., high temperature processing operations, such as, annealing, etc.). Therefore, a person skilled in the art would recognize that, although the different regions (of "fixed" region 20 of FIG. 1) may appear as separate regions with distinct interfaces immediately after formation of these regions, after subsequent processing operations, the materials of the different regions may alloy together to form a single alloyed "fixed" region 20 having a higher concentration of different materials at interfaces between different regions. Thus, in some cases, it may be difficult to distinguish the different regions of the "fixed" region 20 (and other regions) in a finished magnetoresistive stack 100.

With renewed reference to FIG. 1, a "free" region 50, or storage region, may be provided "above" the "fixed" region 20 with an intermediate region 30 formed between the "fixed" region 20 and the "free" region 50. The relative orientation depicted in FIG. 1 is only exemplary. Those of ordinary skill will readily recognize that "free" region 50 may be provided "below" the "fixed" region 20 in the illustration of FIG. 1. As explained previously, the type of intermediate region 30 formed depends upon the type of magnetoresistive stack 100 being fabricated. For a magnetoresistive stack 100 having an MTJ structure, the intermediate region 30 may include a dielectric material and may function as a tunnel barrier. In a spin valve structure, the intermediate region 30 may include a conductive material (e.g., copper) to form a GMR-type magnetoresistive stack 100. Intermediate region 30 may be formed on (or above) a surface of the "fixed" region 20, and the "free" region 50 may be formed on (or above) a surface of the intermediate region 30. In general, intermediate region 30 may be formed on or above the "fixed" region 20 using any technique now known (e.g., deposition, sputtering, evaporation, etc.) or later developed. In some embodiments, intermediate region 30 may include an oxide material, such as, for example, Magnesium Oxide ($MgO_x$) or Aluminum Oxide ($AlO_x$(e.g., $Al_2O_3$)), and may be formed by multiple steps of material deposition and oxidation. In general, intermediate region 30 may have any thickness. In some embodiments, the intermediate region 30 may have a thickness between approximately 8.5-14.1 Å, preferably between approximately 9.6-13.0 Å, and more preferably between approximately 9.8-12.5 Å.

It should be noted that the construction of the "free" region 50 illustrated in FIG. 1 is only exemplary, and many other constructions are possible. Notwithstanding the specific construction of the "free" region 50, as explained previously, a magnetic vector (or moment) in "free" region 50 may be moved or switched by applied magnetic fields or spin torque currents. In some embodiments, the "free" region 50 may include one or more regions 34, 36, 42, 46 formed of a magnetic or ferromagnetic material separated by one or more non-magnetic insertion region(s) 38. The insertion region 38 may provide either ferromagnetic coupling or antiferromagnetic coupling between the ferromagnetic regions 34, 36 and 42, 46 of the "free" region 50. The materials of ferromagnetic regions 34, 36, 42, 46 may include alloys of one or more of ferromagnetic elements, such as, nickel, iron, and/or cobalt, and in some embodiments, boron. In some embodiments, the ferromagnetic regions 34, 36, 42, 46 comprise cobalt, iron, and boron (referred to as CoFeB).

As will be explained in more detail below, in some embodiments, some of the ferromagnetic regions (e.g., regions 42, 46) of "free" region 50 may be formed by directly depositing a boron-containing ferromagnetic alloy (such as, for example, CoFeB), and some of the regions (e.g., regions 34, 36) may be formed by separately depositing a boron-free ferromagnetic alloy (such as, for example, CoFe) and a boron-containing ferromagnetic alloy (e.g., region 32) adjacently. In some such embodiments, the ferromagnetic regions 34, 36 on one side of the insertion region 38 may comprise cobalt and iron (i.e., CoFe) (i.e., a boron-free ferromagnetic alloy), and the ferromagnetic regions 42, 46 on the other side of the insertion region 38 may comprise cobalt, iron, and boron (CoFeB) (i.e., a boron-containing ferromagnetic alloy). As will be explained in more detail later, in some embodiments, the ferromagnetic regions of "free" region 50 on either side of insertion region 38 (e.g., regions 34, 36, 42, and/or 46) may be formed by separately depositing a boron-free ferromagnetic alloy (such as, for example, an alloy of cobalt (Co) and iron (Fe), e.g., cobalt-iron alloy (CoFe) and a boron-containing ferromagnetic alloy (e.g., region 32) adjacent to the boron-free ferromagnetic alloy.

The exact composition of the CoFe in regions 34 and 36, and CoFeB alloys in regions 42 and 46 may depend upon the application. In some embodiments, one or more of the ferromagnetic regions 42, 46 may comprise a CoFeB alloy having a composition of between approximately 10-50 atomic percent (at. %) of Co, approximately 10-35 at. % of B, and the remainder being iron, or preferably between approximately 20-40 at. % Co, approximately 15-30 at. % B, and the remainder being iron, or more preferably approximately 55% at. % Fe, approximately 25 at. % B, and the remaining cobalt. In some embodiments, one or more of the ferromagnetic regions 34, 36 may comprise a CoFe alloy having a composition of between approximately 4-96 at. % Co and the remainder being iron, or preferably between approximately 4-80 at. % Co and the remainder being iron, or more preferably approximately 14-75 at. % Co and the remainder being iron. In some embodiments, the CoFe alloy of ferromagnetic regions 34, 36 may have a crystalline or a non-amorphous crystal structure. In some embodiments, additional elements may be added to the alloys of ferromagnetic regions 34, 36, 42, 46 to provide improved magnetic, electrical, or microstructural properties.

Insertion region 38 may include any nonmagnetic material (now known or developed in the future) that can provide coupling (e.g., ferromagnetic or antiferromagnetic) between the ferromagnetic regions on either side of the intermediate region 38. That is, insertion region 38 may provide coupling between the ferromagnetic regions 34, 36 on the one side, and the ferromagnetic regions 42, 46 on the other side. In some embodiments, the insertion region 38 may include materials such as tantalum (Ta), tungsten (W), molybdenum (Mo), ruthenium (Ru), rhodium (Rh), rhenium (Re), iridium (Jr), hafnium (Hf), chromium (Cr), osmium (Os), and their combinations. Although ferromagnetic regions 34, 36 separated by a single insertion region 38 is illustrated in FIG. 1, this is only exemplary. In general, "free" region 50 may have any number of ferromagnetic regions (1, 2, 3, 4, etc.) with insertion regions 38 provided between adjacent ferromagnetic regions.

In general, the ferromagnetic regions 34, 36, 42, 46 may have any thickness. In some embodiments, the thickness of the ferromagnetic regions 34, 36, 42, 46 may each be between approximately 3-30 Å (preferably approximately 6-17 Å, or more preferably between approximately 8-15 Å).

The thickness of insertion region 38 is typically chosen to provide strong ferromagnetic or antiferromagnetic coupling between the ferromagnetic regions (sometimes referred to as ferromagnetic region 1 (FM1) and ferromagnetic region 2 (FM2)) on either side of the insertion region 38. In general, the insertion region 38 may comprise a thin layer positioned between ferromagnetic regions 34/36 (e.g., ferromagnetic region 1 (FM1)) and ferromagnetic regions 42/46 (e.g., ferromagnetic region 2 (FM2)). The thickness of insertion region 38 may be chosen such that it does not form a continuous layer, which would break or otherwise inhibit the exchange coupling between adjacent ferromagnetic regions. Instead, the material of insertion region 38 may mix with the materials of the adjacent ferromagnetic regions 34, 36 and 42, 46 to form a uniform layer, or may form a layer that is not continuous, so that the adjacent ferromagnetic regions 34, 36 and 42, 46 are directly exchange coupled to each other and the entire structure acts as a single ferromagnetic "free" region of stack 100. In general, the thickness of the insertion region 38 may be between approximately 1-12 Å (preferably approximately 2-6 Å, or more preferably between approximately 2.5-4 Å). In some embodiments, the as-deposited thickness of the insertion region 38 may be less than approximately 5 Å, or between approximately 2 Å and 4.5 Å, or approximately 3 Å.

With continuing reference to FIG. 1, in some embodiments, region 32, which may include a boron-containing ferromagnetic alloy, may be provided as part of the "free" region 50. Although not a requirement, in some embodiments, as illustrated in FIG. 1, region 32 may be provided between the ferromagnetic region 34 and intermediate region 30 (which, as explained above, may include a dielectric material and may function as a tunnel barrier in an MTJ stack 100). Region 32 may comprise a boron alloy having between about 30 at. % or greater and less than about 100 at. % of boron, and preferably between approximately 40 to 60 at. % of boron, and more preferably between approximately 45 to 55 at. % of boron. In some embodiments, region 32 may consist essentially of approximately 50 at. % of boron and the remainder may be iron (i.e., FeB50 in atomic percent). In some embodiments, the boron alloy of region 32 may have an amorphous crystal structure. In some embodiments, the material of region 32 may also include additional elements to improve the magnetic and other properties of the region 32. In some embodiments, region 32 may include any suitable composition of boron that is less than 100 at. %. Stated differently, region 32 may not include only pure boron. In general, region 32 may have any thickness. In some embodiments, the thickness of region 32 may be between approximately 2-9 Å (preferably approximately 3-8 Å, or more preferably between approximately 4-7 Å).

Experimental studies have indicated that a "free" region 50 formed by depositing a boron-containing region (such as, e.g., region 32 of FIG. 1) adjacent to ferromagnetic regions formed of a boron-free ferromagnetic alloy (such as, e.g., regions 34, 36) may improve the performance of the resulting magnetoresistive stack 100 (especially at relatively high temperatures (e.g., approximately 260° C.) in embedded MRAM applications) as compared to an exemplary "free" region 50 where the ferromagnetic regions are formed using a boron containing ferromagnetic alloy (e.g., CoFeB) (i.e., without a separate boron-containing alloy adjacent to a boron-free alloy—similar to regions 42 and 46 of FIG. 1). It was found that increasing the concentration of boron in region 32 may increase defects (e.g., shorts, etc.) and may reduce performance and yield of the magnetoresistive stack 100. Moreover, at increased concentrations (such as, e.g., pure boron), boron sputtering targets are known to be porous (e.g., having a density of approximately 50% of theoretical bulk density even if the targets are fabricated at high temperatures and pressures). Sputter depositing a boron-containing region (such as region 32) using a porous sputtering target may generate a large number of particles and may result in an increase in electrical shorts and other defects in the resulting magnetoresistive stack 100.

To study the effect of boron concentration on defects, boron alloy films (such as region 32) formed by sputter targets having different boron concentrations were evaluated. During these studies, it was found that as the boron concentration in the targets increased, the number of particles (an indicator of defects in the resulting magnetoresistive stack 100) also increased. It was found that the density of the boron sputtering target decreased dramatically as boron content increased above about 30 at. %, and even more dramatically as the boron content increased above about 50 at. %. For example, these studies indicated that a 200 Å thick film comprising about 60 at. % boron and the remainder being iron (i.e., FeB60 in atomic percent) had a particle count of about 19000, while a 200 Å FeB50 (in atomic percent) film had a particle count of only about 400, and an FeB50 (in atomic percent) film having a thickness between about 10-50 Å had a particle count of between about 120-180. It should be noted that, in some embodiments of stack 100, region 32 comprising an iron-boron (FeB) alloy may be less than about 10 Å thick, and therefore should have lower particle count and defect density. The magnetic properties (such as, for example, MR ratio, resistance-area product or RA, perpendicular magnetic anisotropy (PMA), etc.) of the "free" region 50 with region 32 comprising an FeB alloy (e.g., FeB50 (in atomic percent)) at room temperature was also found to be similar to or better than a "free" region 50 without region 32 (i.e., where the ferromagnetic regions are formed of CoFeB). Based on these studies, it was determined that a boron concentration of greater than, or equal to, approximately 30 at. % and less than 100 at. % in the boron-containing region 32 (preferably between approximately 40 to 60 at. %, and more preferably between approximately 45 to 55 at. %) will improve the performance of the magnetoresistive stack 100.

With continuing reference to FIG. 1, after forming "free" region 50 as described above, a second intermediate region 60 may be formed on or above the "free" region 50. In embodiments of magnetoresistive stack 100 used in an MTJ device, both regions 30 and 60 may include a dielectric material and may function as a tunnel barrier. In some embodiments, intermediate region 60 may include the same material as intermediate region 30. However, this is not a limitation, and in some embodiments, regions 30 and 60 may include different dielectric materials. For example, region 30 may include $MgO_x$ and region 60 may include $AlO_x$ (e.g., $Al_2O_3$). In some embodiments, region 60 also may be similar in thickness to region 30. In other embodiments, region 60 may have a thickness that is larger or smaller than the thickness of region 30. In some embodiments, region 60 may have a thickness between approximately 3-14 Å, preferably between approximately 5-12 Å, and more preferably between approximately 6-10 Å. Although not illustrated in FIG. 1, in some embodiments, a dusting of an interfacial material (e.g., iridium, chromium, etc.) may also be provided at the interface between the "free" region 50 and the second intermediate region 60. This interfacial material, deposited as, e.g., a discontinuous patchwork of material (as opposed to a continuous layer that would break exchange between the mating layers), may result in a high perpendicular magnetic anisotropy (PMA) of the resulting magnetoresistive stack 100. Moreover, those of ordinary skill in the art also will recognize that region 60 also may include a non-magnetic conductive material, such as, e.g., Copper.

A second "fixed" region 120 may be formed on or above intermediate region 60. Although "fixed" region 120 is illustrated as a single layer in FIG. 1, "fixed" region 120 may also include a multi-layered structure similar to that described with reference to "fixed" region 20. In some embodiments, a spacer region 64 and a capping region 66 may be formed above the second "fixed" region 120, and electrode 70 may be formed above the capping region 66. The capping region 66 may be formed from any suitable conductive material (for example, a suitable metallic material, including, but not limited to, tantalum, titanium, tungsten, etc.) and may have any suitable thickness between approximately 50-150 Å. In some embodiments, the thickness of the spacer region 64 may be between approximately 10-50 Å, or preferably between approximately 15-40 Å, or more preferably between approximately 20-30 Å. The spacer region 64 may be formed of a non-ferromagnetic material, such as, e.g., ruthenium or an alloy of ruthenium. In some embodiments, spacer region 64 may include cobalt, iron, boron, or an alloy thereof (e.g., CoFeB). In some embodiments, the spacer region 64 may be formed of a bilayer structure comprising Ru and/or a CoFeB layer. In some embodiments, the thickness of the spacer region 64 may be approximately 5-50 Å, or preferably approximately 10-35 Å, or more preferably approximately 22-28 Å.

As explained previously, the magnetoresistive stack 100 of FIG. 1 represents a dual spin filter structure where a "free" region 50 is formed between a first "fixed" region 20 and a second "fixed" region 120. However, this structure is only exemplary. In some embodiments, the second "fixed" region 120 may be eliminated to form a magnetoresistive stack having a single MTJ (magnetic tunnel junction) structure. Further, the structures of "free" region 50 and the "fixed" regions 20 and 120 described with reference to FIG. 1 are only exemplary. For example, U.S. Pat. Nos. 8,686,484; 9,136,464; and 9,419,208, each assigned to the Assignee of the current application and incorporated by reference in its entirety herein, disclose several exemplary magnetoresistive stacks, and methods of making such stacks. Specifically, "fixed" regions 20, 120 and "free" region 50 may have any of the structures and configurations disclosed in these references. Additionally, a few exemplary alternate configurations of the "free" region 50 of FIG. 1 are described below.

As described above, the "free" region 50 of FIG. 1 may include a boron-containing region 32 deposited proximate boron-free ferromagnetic regions 34 and 36 to improve the performance of the resulting magnetoresistive stack 100 at relatively high temperatures, e.g., 260° C., (as compared to an exemplary "free" region 50 where a boron containing ferromagnetic alloy (e.g., CoFeB) is directly deposited to form the ferromagnetic regions of the "free" region (similar to regions 42 and 46 of FIG. 1)). The exact composition of the materials in "free" region 50 may depend upon the application. With reference to the structure of the "free" region 50 of FIG. 1, in some embodiments, the "free" region 50 may include: an approximately 2-9 Å thick boron-containing region 32 comprising essentially of FeB50 (in atomic percent); ferromagnetic regions 34 and 36 both comprising a boron-free materials, such as, e.g., cobalt, iron, or an alloy of cobalt and iron of any relative composition (i.e., $CoFe_x$, where x is any value, e.g., approximately 50 at. %); an approximately 3 Å thick insertion region 38 including one or more of molybdenum, tantalum, tungsten, or zirconium; a ferromagnetic region 42 comprising a boron-containing ferromagnetic alloy such as, for example, CoFe55B25 in atomic percent; and an approximately 1-3 Å thick ferromagnetic region 46 comprising essentially of iron. In some embodiments, the boron-free materials of ferromagnetic regions 34 and 36 may include an alloy of cobalt and iron with cobalt in the range of approximately 4-96% in atomic percent. It is also contemplated that substantially pure cobalt may be used as the boron-free material.

Figure 2A:
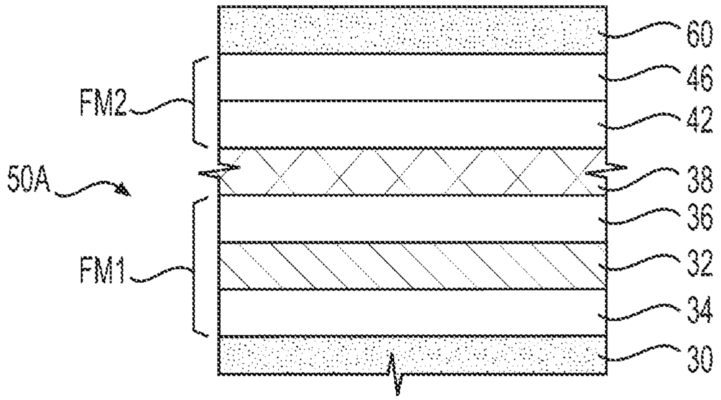

In the "free" region 50 of FIG. 1, the boron-containing region 32 may be positioned between the intermediate region 30 (which is formed of a dielectric material in an MTJ structure) and the boron-free ferromagnetic region 34. However, this is not a requirement. FIGS. 2A-2G are schematic illustrations of exemplary "free" regions 50A-50G formed by two ferromagnetic regions (indicated in FIGS. 2A-2G as ferromagnetic region 1 (FM1) and ferromagnetic region 2(FM2)) separated by a non-magnetic insertion region 38. As illustrated in FIG. 2A, in ferromagnetic region FM1 of an exemplary "free" region 50A, the boron-containing region 32 is positioned between two boron-free ferromagnetic regions 34 and 36. In some such embodiments, the "free" region 50A may include: an approximately 1.5 Å thick ferromagnetic region 34 including iron, cobalt, or an iron-cobalt alloy; an approximately 2-9 Å thick boron-containing region 32 including, e.g., FeB50 in atomic percent; a ferromagnetic region 36 comprising a boron-free material such as, e.g., iron, cobalt, or an alloy of cobalt and iron of any relative composition (i.e., $CoFe_x$, x is from 0 to 100 atomic percent); an approximately 3 Å thick insertion region 38 including one or more of molybdenum, tantalum, tungsten, hafnium, zirconium, or an alloy of these materials; a ferromagnetic region 42 comprising a boron-containing ferromagnetic alloy such as, for example, CoFe55B25 in atomic percent; and an approximately 1-3 Å thick ferromagnetic region 46 including at least iron. In some embodiments, one or more elements of the boron-containing region may be selected from iron or cobalt and others.

Figure 2B:
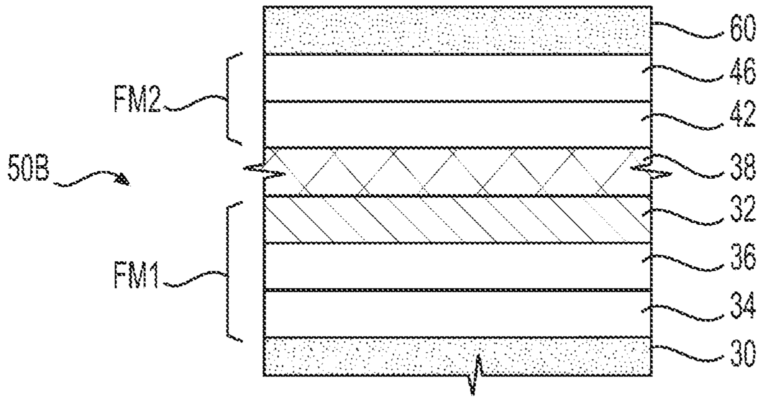

FIG. 2B illustrates another exemplary "free" region 50B of a magnetoresistive stack 100. As illustrated in FIG. 2B, a ferromagnetic region (e.g., FM1) of the "free" region 50B may include a boron-containing region 32 (such as, for example, comprising FeB50 or another alloy of iron and boron having a boron concentration above 30 at. %, or between 40 and 60 at. %) provided between the insertion region 38 and the boron-free ferromagnetic region 36. In some such embodiments, the "free" region 50B may include: an approximately 1.5 Å thick ferromagnetic region 34 comprising iron, cobalt, or an iron-cobalt alloy; a ferromagnetic region 36 comprising a boron-free material such as, e.g., iron, cobalt, or an alloy of cobalt and iron of any relative composition (i.e., $CoFe_x$, x is from 0 to 100 atomic percent); an approximately 2-9 Å thick boron-containing region 32 comprising essentially of FeB50; an approximately 3 Å thick insertion region 38 including molybdenum, tantalum, tungsten, zirconium, etc.); a ferromagnetic region 42 comprising a boron-containing ferromagnetic alloy such as, for example, CoFe55B25; and an approximately 1-3 Å thick ferromagnetic region 46 including at least iron. In FIG. 2B, the boron-containing region 32 that was provided between the boron-free ferromagnetic regions 34 and 36 in FIG. 2A is depicted as being positioned between regions 36 and 38. However, this is only exemplary. In some embodiments, a boron-containing region (e.g., such as region 32)

may be provided both between regions 34 and 36 and regions 36 and 38 (and in some embodiments, also between regions 30 and 34).

Figure 2C:
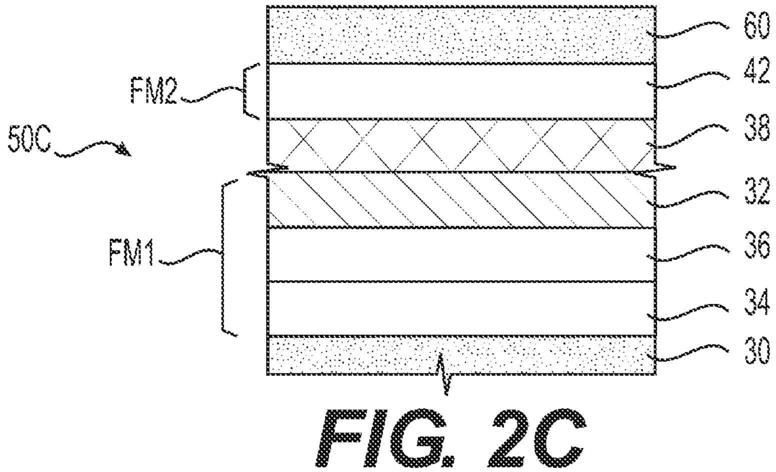

Although in the description above, both sides of the insertion region 38 are described as including a pair of ferromagnetic regions (34/36 and 42/46), this is only exemplary. In general, any number (1, 2, 3, 4, etc.) of ferromagnetic regions may be positioned on either side of the insertion region 38. In some embodiments, as illustrated in FIG. 2C, "free" region 50C may include boron-free ferromagnetic regions 34 and 36 positioned proximate a boron-containing region 32 located on one side of an insertion region 38, and a single boron-containing ferromagnetic region 42 positioned on the opposite side of the insertion region 38. Similarly, in some embodiments, a "free" region 50C may include a single boron-free ferromagnetic region 34 positioned proximate a boron-containing region 32 on one side of the insertion region 38, and a single boron-containing ferromagnetic region 42 positioned on the opposite side of the insertion region 38. With reference to the "free" region 50C of FIG. 2C, in some embodiments, region 34 may be approximately 1.5 Å thick and include iron, cobalt, or an alloy thereof; region 36 may include boron-free material such as, e.g., iron, cobalt, or an alloy of cobalt and iron of any relative composition (i.e., $CoFe_x$, x is from 0 to 100 atomic percent); region 32 may include an approximately 2-9 Å thick alloy of iron and boron (such as, for example, FeB50), region 38 may include an approximately 3 Å thick layer of one or more of molybdenum, tantalum, tungsten, zirconium, etc.; and region 42 may include a boron-containing ferromagnetic alloy (such as, for example, CoFe55B25 in atomic percent) of any thickness.

Figure 2D:
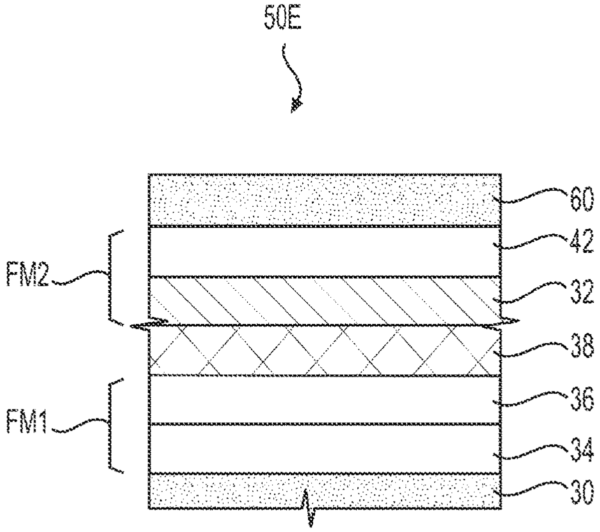
Figure 2E:
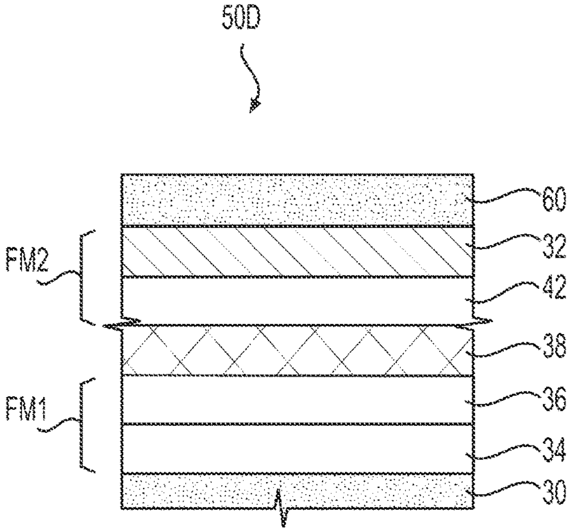

In some embodiments, a boron-containing region (such as region 32) may additionally, or alternatively, be positioned proximate the ferromagnetic regions (e.g., FM2 or regions 42, 46) above (in the relative orientation of, e.g., FIG. 2D) the insertion region 38. For example, as illustrated in FIGS. 2D and 2E, in some embodiments, a "free" region 50D or 50E may include: boron-containing ferromagnetic regions 34 and 36 (such as, for example, regions 34 and 36 may both include a cobalt-iron-boron alloy, e.g., CoFe55B25 in atomic percent, or region 34 or region 36 may include exclusively or predominantly iron or cobalt, and the other of region 34 and region 36 may include a cobalt-iron-boron alloy, e.g., CoFe55B25 in atomic percent) located on one side (e.g., below in the orientation of FIG. 2D) of an insertion region 38, and a boron-free ferromagnetic region 42 (e.g., cobalt, iron, or a cobalt-iron alloy e.g., $CoFe_x$, x is from 0 to 100 atomic percent) positioned proximate a boron-containing region 32 (e.g., FeB50 in atomic percent) on the opposite side of insertion region 38. The boron-containing region 32 may be positioned above the boron-free ferromagnetic region 42 as illustrated in FIG. 2D or below region 42 (i.e., between the insertion region 38 and region 42) as illustrated in FIG. 2E. In some embodiments, the boron-free ferromagnetic region 42 may comprise a cobalt-iron alloy ($CoFe_x$, x is from 0 to 100 atomic percent), and in some embodiments, region 42 may include exclusively or predominantly cobalt or iron.

Figure 2F:
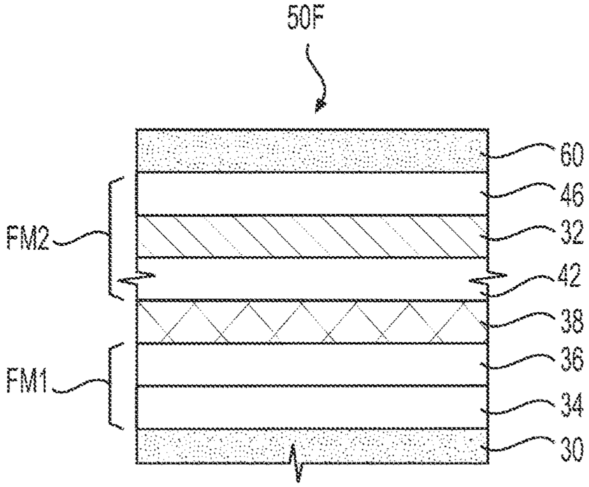
Figure 2G:
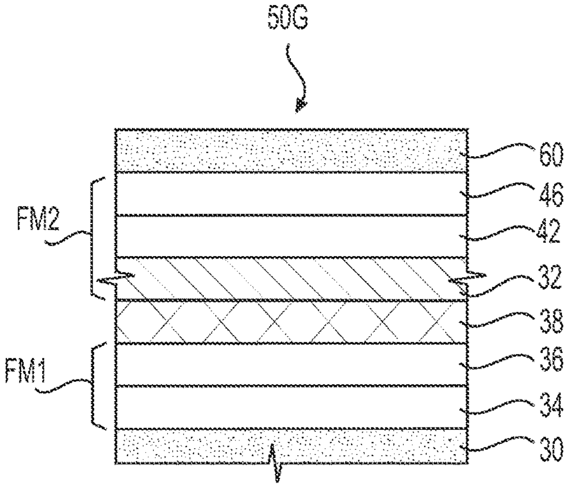

In some embodiments, as illustrated in FIGS. 2F and 2G, a "free" region 50F or 50G may include boron-containing ferromagnetic regions 34 and 36 (such as, for example, regions 34 and 36 may both include a cobalt-iron-boron alloy, e.g., CoFe55B25 in atomic percent, or region 34 or region 36 may include exclusively or predominantly iron or cobalt, and the other of region 34 and region 36 may include a cobalt-iron-boron alloy, e.g., CoFe55B25 in atomic percent) located on one side (e.g., below in the orientation of FIG. 2F) of an insertion region 38, and boron-free ferromagnetic regions 42 and 46 (e.g., $CoFe_x$ or Fe) positioned proximate a boron-containing region 32 (e.g., FeB50) on the opposite side of the insertion region 38. In some embodiments, as illustrated in FIG. 2F, the boron-containing region 32 may be positioned between the boron-free ferromagnetic regions 42 and 46, and in some embodiments, the boron-containing region 32 may be positioned below the boron-free ferromagnetic regions 42 and 46 (i.e., between the insertion region 38 and region 42). Alternatively, or additionally, in some embodiments, the boron-containing region 32 may be positioned above the boron-free ferromagnetic regions 42 and 46 of FIGS. 2F and 2G. That is, the boron-containing region 32 may be disposed between boron-free ferromagnetic region 46 and second intermediate region 60.

It should be noted that although the boron-containing region 32 is illustrated as being positioned only on one side of the insertion region 38 (i.e., FM1 or FM2) in the embodiments of the "free" regions discussed above, this is only exemplary. In some embodiments, as will be described in more detail below, both FM1 and FM2 (i.e., the ferromagnetic regions above and below the insertion region 38) of "free" region may include a boron-containing region 32 positioned proximate a ferromagnetic region. It should also be noted that the above-described compositions and thicknesses of the various regions are only exemplary. For example, although the boron-containing region 32 is described as comprising FeB50 in atomic percent, this is only exemplary. In general, region 32 may include any alloy of iron and boron having a boron concentration above 30 at. %, or between 40 and 60 at. %. In some embodiments, region 32 may include any alloy of iron and boron having a boron concentration less than 100 at. %. It is contemplated that, in some embodiments, a boron-containing region (e.g., a high-boron alloy) and a boron-free region may be used in other layers of the MTJ stack, such as, for example, the reference layer.

It should be emphasized that the compositions and thicknesses of the regions described herein are as-deposited values. In some embodiments, these described values are those that are seen immediately after deposition. In some embodiments, the described thicknesses and compositions are the target thicknesses and the composition of the sputter targets used in the deposition of the various regions. As known to those of ordinary skill in the art, experimental variations in these thicknesses and compositions can be expected. Further, as known to those of ordinary skill in the art, over time and/or exposure to high temperatures (such as, for example, during annealing, etc.), the materials of the various regions of the "free" regions 50, 50A, 50B, etc. may alloy with each other to form a more homogenous structure without distinct interfaces demarcating the different regions. In such a structure, boron from the boron-containing region 32 may alloy with, and diffuse, into adjacent boron-free ferromagnetic regions (e.g., regions 34 and 36 in the embodiments of FIGS. 1-2C and regions 42 and/or 46 in the embodiments of FIGS. 2D-2G). As a result of such alloying, over time, regions that were formed by depositing a boron-free ferromagnetic alloy may include some amount of boron. However, an increased boron concentration at region 32 and/or a decreasing boron concentration from region 32 towards the originally boron-free magnetic alloy may still be noticeable in the structure upon analysis.

As explained above, in some embodiments, the ferromagnetic regions (i.e., FM1 and FM2) on either side of the insertion region 38 may include an amorphous boron-containing or boron-rich region (such as, e.g., region 32) positioned proximate crystalline (or non-amorphous) boron-free (or boron-lean, in some cases) ferromagnetic regions (e.g., regions 34, 36) to improve the performance of the resulting magnetoresistive stack 100 at relatively high temperatures. In some embodiments, one or both the ferromagnetic regions (i.e., FM1 and FM2) on either side of insertion region 38 may include a multi-layer structure of a crystalline (or non-amorphous) magnetic material and an amorphous magnetic material. The crystalline magnetic material may include a boron-free (or boron-lean, in some embodiments) ferromagnetic material and the amorphous magnetic material may include a boron-rich ferromagnetic material. In some embodiments, the crystalline boron-free ferromagnetic material may include at least one of iron (Fe), cobalt (Co), or an alloy of cobalt and iron (CoFe), and the amorphous boron-rich ferromagnetic material may include an alloy of iron and boron (FeB), an alloy of cobalt and boron (CoB), or an alloy of cobalt, iron, and boron (CoFeB).

FIGS. 3A-3C illustrate exemplary "free" regions 50H-50J of a magnetoresistive stack 100 where the ferromagnetic regions (i.e., FM1 and FM2) on both sides of the insertion region 38 includes alternating amorphous boron-rich and crystalline boron-lean (or boron-free) regions. In some embodiments, as illustrated in "free" region 50H of FIG. 3A, ferromagnetic regions (FM1 and FM2) on both sides of insertion region 38 may include an amorphous boron-rich region 132 positioned between two crystalline boron-free regions 134, 136. In some embodiments, as illustrated in FIGS. 3B and 3C, ferromagnetic region 1 (FM1) may include an amorphous boron-rich region 132 positioned next to a crystalline boron-free region 134 (which is positioned adjacent to the insertion region 38), and ferromagnetic region 2 (FM2) may include an amorphous boron-rich region 132 positioned between two crystalline boron-free regions 134, 136. With reference to ferromagnetic region 1 (FM1), the boron-rich region 132 may be positioned below the boron-free region 134 (see "free" region 50I of FIG. 3B) or above the boron-free region 134 (see "free" region 50J of FIG. 3C). In some embodiments, the ferromagnetic region above the insertion region 38 (i.e., FM2) may have a configuration as illustrated in FIG. 3B or 3C and the ferromagnetic region below the insertion region 38 (i.e., FM1) may have the configuration of FM1 in FIG. 3A. It should be noted that, in some embodiments, regions 132, 134 and/or 136 above and below insertion region 30 may have different thicknesses based on device performance requirements.

In some embodiments, the amorphous boron-rich region 132 of FIGS. 3A-3C may include any one or more of the following alloys: (a) an alloy of iron (Fe) and boron (B) having a composition $Fe_x$,$B_{100-X}$; (b) an alloy of cobalt (Co) and boron (B) having a composition $Co_xB_{100-x}$; (c) an alloy of a cobalt-iron alloy (CoFe) and boron having a composition $(CoFe)_xB_{100-x}$; (d) or an alloy of cobalt, iron, and an element M (CoFeM, where element M is one of tantalum (Ta), hafnium (Hf), zirconium (Zr), or chromium (Cr)) alloyed with boron (B) having a composition $(CoFeM)_xB_{100-X}$. In the above described alloys, X may be between 40 and 80 (in atomic percent). In some embodiments, the non-amorphous (or crystalline) boron-free region 134, 136 of ferromagnetic region 1 (FM1) and ferromagnetic region 2 (FM2) may be an alloy of iron and cobalt (CoFe) having a composition $Co_xFe_{100-X}$, where X is between 0 and 100 in atomic percent. The configurations of "free" regions discussed above may result in a low switching voltage and a relatively higher energy barrier. The switching voltage and energy barrier may be tuned by adjusting the non-amorphous alloy's composition and thickness, as well as amorphous B-rich regions' alloy composition and thickness, as desired.

As alluded to above, magnetoresistive stack 100 may be implemented in a sensor architecture or a memory architecture (among other architectures). For example, in a memory configuration, the magnetoresistive stack 100 may be electrically connected to an access transistor and configured to couple or connect to various conductors, which may carry one or more control signals, as shown in FIG. 4. The magnetoresistive stack 100 of the current disclosure may be used in any suitable application, including, e.g., in a memory configuration. In such instances, the magnetoresistive stack 100 may be formed as an integrated circuit comprising a discrete memory device (e.g., as shown in FIG. 5A) or an embedded memory device having a logic therein (e.g., as shown in FIG. 5B), each including MRAM, which, in one embodiment is representative of one or more arrays of MRAM having a plurality of magnetoresistive stacks, according to certain aspects of certain embodiments disclosed herein.

Exemplary methods of fabricating selected embodiments of the disclosed magnetoresistive stack 100 (e.g., magnetoresistive stack 100 of FIG. 1) will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 6 depicts a flow chart of an exemplary method 200 of fabricating magnetoresistive stack 100 according to the present disclosure. In the discussion below, reference will be made to both FIGS. 1 and 6. A first electrode (e.g., bottom electrode 10) may be first formed on the backend (surface with circuitry) of a semiconductor substrate 2 by any suitable process (step 210). A "fixed" region 20 then may be formed on or above an exposed surface of electrode 10 (step 220). In some embodiments, "fixed" region 20 may be formed by providing (e.g., sequentially) the different regions (e.g., regions 14, 16, 18, 22, and 24) that comprise the "fixed" region 20 on the surface of electrode 10. An intermediate region 30 then may be formed on or above an exposed surface of the "fixed" region 20 (step 230). A "free" region 50 may be formed on or above the exposed surface of the intermediate region 30 (step 240). In some embodiments, the "free" region 50 may be formed by first providing a boron-containing alloy, such as, for example, FeB50 (in atomic percent), on the exposed surface of the intermediate region 30 to form region 32 (step 242), and then providing one or more boron-free ferromagnetic alloys (such as, for example, $CoFe_x$, x is from 0 to 100 atomic percent) on the exposed surface of region 32 to form regions 34 and 36 (step 244). Next, an insertion region 38 is formed by providing a layer of molybdenum (or tantalum, tungsten, or zirconium) on or above the exposed surface of the boron-free ferromagnetic region 36 (step 246). One or more boron-containing ferromagnetic alloys (such as, for example, CoFe55B25 in atomic percent) are then provided on the exposed surface of region 38 to form regions 42 and 46 (step 248). In some embodiments, as described in connection with FIGS. 3A-3C above, free region 50 may be formed by providing (e.g., depositing) alternating amorphous boron-rich and crystalline boron-lean (or boron-free) regions on one or both sides of the insertion region 38. A dielectric material may then be provided on the exposed surface of the "free" region 50 to form second intermediate region 60 (step 250), and a second "fixed" region 120 may be formed on the exposed surface of region 60 (step 260). Similar to step 220 above, the "fixed" region 120 may be formed by sequentially providing the different regions that comprise the "fixed" region 120 on the surface of intermediate region 60. A spacer region 64 and a capping region 66 may be formed on or above (i.e., on an exposed surface of) the "fixed" region 120 (step 270), and the second electrode 70 formed on the exposed surface of region 66 (step 280). It should be noted that, in some embodiments, some of the above described steps (or regions) may be eliminated to form other embodiments of magnetoresistive stacks. For example, to form an exemplary magnetoresistive stack having a single MTJ structure, step 260 may be eliminated.

Any suitable method may be used to form the different regions of the magnetoresistive stack 100. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. And, forming thin insulating layers (e.g., intermediate regions 30 and 60, which form tunnel barrier layers) may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the regions of magnetoresistive stack 100 may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

In one aspect, a magnetoresistive device is disclosed. The magnetoresistive device may include an intermediate region, a magnetically fixed region on one side of the intermediate region, and a magnetically free region on an opposite side of the intermediate region. The magnetically free region may include at least a first ferromagnetic region and a second ferromagnetic region separated by a non-magnetic insertion region. At least one of the first ferromagnetic region and the second ferromagnetic region may include at least a boron-rich ferromagnetic layer positioned proximate a boron-free ferromagnetic layer.

Various embodiments of the disclosed magnetoresistive device may alternatively or additionally include one or more of the following aspects: the boron-free ferromagnetic layer may include an alloy of cobalt and iron; the boron-free ferromagnetic layer may include an alloy of cobalt and iron having a composition between approximately 4-80% atomic percent of cobalt; the boron-rich ferromagnetic layer may include an alloy of iron and boron; the boron-rich ferromagnetic layer may include an alloy of boron having a composition between approximately 40-60% atomic percent of boron; the boron-free ferromagnetic layer may include an alloy of cobalt and iron having a composition between approximately 14-75% atomic percent of cobalt, and the boron-rich ferromagnetic layer may include an alloy of iron and boron having a composition between approximately 45-55% atomic percent of boron; the boron-free ferromagnetic layer may include an alloy of at least cobalt and iron and have a crystalline microstructure, and the boron-rich ferromagnetic layer may include an alloy of at least iron and boron and have an amorphous microstructure; at least one of the first ferromagnetic region and the second ferromagnetic region may include at least a boron-rich ferromagnetic layer positioned between two boron-free ferromagnetic layers; the boron-free ferromagnetic layer may include an alloy of iron and cobalt having a composition $Co_xFe_{100-X}$, where X is between 0 and 100 (in atomic percent); the boron-rich ferromagnetic layer may include one or more of (a) an alloy of iron and boron having a composition $Fe_xB_{100-X}$, (b) an alloy of cobalt and boron having a composition $Co_xB_{100-X}$, (c) an alloy of a cobalt-iron alloy and boron having a composition $(CoFe)_xB_{100-X}$, and (d) an alloy of cobalt, iron, and an element M, where element M is one of tantalum, hafnium, zirconium, or chromium, and boron having a composition $(CoFeM)_xB_{100-X}$, and wherein X is between 40 and 80 (in atomic percent); both the first ferromagnetic region and the second ferromagnetic region may include at least a boron-rich ferromagnetic layer positioned proximate a boron-free ferromagnetic layer; each of the first ferromagnetic region and the second ferromagnetic region may include at least a boron-rich ferromagnetic layer positioned between two boron-free ferromagnetic layers; each of the first ferromagnetic region and the second ferromagnetic region may include at least a boron-rich ferromagnetic layer positioned proximate a boron-free ferromagnetic layer, and wherein the boron-rich ferromagnetic layer includes one or more of (a) an alloy of iron and boron having a composition $Fe_xB_{100-X}$, (b) an alloy of cobalt and boron having a composition $Co_xB_{100-X}$, (c) an alloy of a cobalt-iron alloy and boron having a composition $(CoFe)_xB_{100-X}$, and (d) an alloy of cobalt, iron, and an element M, where element M is one of tantalum, hafnium, zirconium, or chromium, and boron having a composition $(CoFeM)_xB_{100-X}$, and wherein X is between 40 and 80 (in atomic percent); and each of the first ferromagnetic region and the second ferromagnetic region may include at least a boron-rich ferromagnetic layer positioned proximate a boron-free ferromagnetic layer, and the boron-free ferromagnetic layer may include an alloy of iron and cobalt having a composition $Co_xFe_{100-X}$, where X is between 0 and 100 (in atomic percent).

In some aspects, a magnetoresistive device is disclosed. The magnetoresistive device may include an intermediate region, a magnetically fixed region on one side of the intermediate region, and a magnetically free region on an opposite side of the intermediate region. The magnetically free region may include at least a first ferromagnetic region and a second ferromagnetic region separated by a non-magnetic insertion region. At least one of the first ferromagnetic region and the second ferromagnetic region may include at least a boron-rich ferromagnetic layer positioned proximate a boron-free ferromagnetic layer. The boron-rich ferromagnetic layer may include one or more of (a) an alloy of iron and boron having a composition $Fe_xB_{100-X}$, (b) an alloy of cobalt and boron having a composition $Co_xB_{100-X}$, (c) an alloy of a cobalt-iron alloy and boron having a composition $(CoFe)_xB_{100-X}$, and (d) an alloy of cobalt, iron, and an element M, where element M is one of tantalum, hafnium, zirconium, or chromium, and boron having a composition $(CoFeM)_xB_{100-X}$, and wherein X is between 40 and 80. And, the boron-free ferromagnetic layer may include an alloy of iron and cobalt having a composition $Co_xFe_{100-X}$, where X is between 0 and 100 (in atomic percent).

Various embodiments of the disclosed magnetoresistive device may alternatively or additionally include one or more of the following aspects: the boron-free ferromagnetic layer may include between approximately 4-80% atomic percent of cobalt; the boron-rich ferromagnetic layer may include between approximately 40-60% atomic percent of boron; the boron-free ferromagnetic layer may include between approximately 14-75% atomic percent of cobalt, and the boron-rich ferromagnetic layer may include between approximately 45-55% atomic percent of boron; each of the first ferromagnetic region and the second ferromagnetic region may include at least a boron-rich ferromagnetic layer positioned proximate a boron-free ferromagnetic layer; and at least one of the first ferromagnetic region and the second ferromagnetic region may include at least a boron-rich ferromagnetic layer positioned between two boron-free ferromagnetic layers.

Although various embodiments of the present disclosure have been illustrated and described in detail, it will be readily apparent to those skilled in the art that various modifications may be made without departing from the present disclosure or from the scope of the appended claims.

We claim:

1. A magnetoresistive device, comprising:
- an intermediate region;
- a magnetically fixed region on one side of the intermediate region; and
- a magnetically free region on an opposite side of the intermediate region, wherein the magnetically free region includes at least a first ferromagnetic region and a second ferromagnetic region separated by a non-magnetic insertion region, wherein each of the first ferromagnetic region and the second ferromagnetic region includes at least a boron-rich ferromagnetic layer contacting the non-magnetic insertion region and positioned proximate a boron-free ferromagnetic layer,
- wherein the boron-rich ferromagnetic layer includes an alloy consisting of (i) boron and (ii) only one of iron or cobalt, and
- wherein the boron-free ferromagnetic layer includes an alloy consisting of cobalt and iron.

2. The magnetoresistive device of claim 1, wherein the boron-free ferromagnetic layer is formed on the boron-rich ferromagnetic layer.

3. The magnetoresistive device of claim 1, wherein the alloy consisting of cobalt and iron has a composition between approximately 4-80% atomic percent of cobalt.

4. The magnetoresistive device of claim 1, wherein the alloy consisting of (i) boron and (ii) only one of iron or cobalt has a composition between approximately 40-60% atomic percent of boron.

5. The magnetoresistive device of claim 1, wherein the alloy consisting of cobalt and iron has a composition between approximately 14-75% atomic percent of cobalt.

6. The magnetoresistive device of claim 1, wherein the alloy consisting of cobalt and iron has a crystalline microstructure, and the alloy consisting of (i) boron and (ii) only one of iron or cobalt has an amorphous microstructure.

7. The magnetoresistive device of claim 1, wherein at least one of the first ferromagnetic region and the second ferromagnetic region includes at least a boron-rich ferromagnetic layer positioned between two boron-free ferromagnetic layers.

8. The magnetoresistive device of claim 1, wherein the non-magnetic insertion region is formed on the boron-rich ferromagnetic layer.

9. The magnetoresistive device of claim 1, wherein each of the first ferromagnetic region and the second ferromagnetic region includes at least a boron-rich ferromagnetic layer positioned between two boron-free ferromagnetic layers.

10. A magnetoresistive device, comprising:
- an intermediate region;
- a magnetically fixed region on one side of the intermediate region; and
- a magnetically free region on an opposite side of the intermediate region, wherein the magnetically free region includes at least a first ferromagnetic region and a second ferromagnetic region separated by a non-magnetic insertion region, wherein each of the first ferromagnetic region and the second ferromagnetic region includes at least a boron-rich ferromagnetic layer contacting the non-magnetic insertion region and positioned proximate a boron-free ferromagnetic layer,
- the boron-rich ferromagnetic layer including:
  - (a) an alloy consisting of (i) boron and (ii) only one of iron or cobalt, or (b) an alloy of cobalt, iron, and an element M, where element M is one of tantalum, hafnium, zirconium, or chromium, and boron having a composition $(CoFeM)_xB_{100-X}$, wherein X is between 40 and 80 in atomic percent, and
- the boron-free ferromagnetic layer including an alloy consisting of iron and cobalt.

11. The magnetoresistive device of claim 10, wherein the boron-free ferromagnetic layer includes between approximately 4-80% atomic percent of cobalt, and wherein the boron-rich ferromagnetic layer includes between approximately 40-60% atomic percent of boron.

12. The magnetoresistive device of claim 10, wherein the boron-free ferromagnetic layer includes between approximately 14-75% atomic percent of cobalt, and the boron-rich ferromagnetic layer includes between approximately 45-55% atomic percent of boron.

13. The magnetoresistive device of claim 10, wherein at least one of the first ferromagnetic region and the second ferromagnetic region includes at least a boron-rich ferromagnetic layer positioned between two boron-free ferromagnetic layers.

14. The magnetoresistive device of claim 10, wherein the non-magnetic insertion region is formed on the first ferromagnetic region and the second ferromagnetic region is formed on the non-magnetic insertion region, and
- wherein the boron-rich ferromagnetic layer is formed on the boron-free ferromagnetic layer in the first ferromagnetic region or the boron-free ferromagnetic layer is formed on the boron-rich ferromagnetic layer in the second ferromagnetic region.

15. A magnetoresistive device, comprising:

an intermediate region, wherein the intermediate region includes at least one dielectric layer that forms a tunnel barrier;

a magnetically fixed region on one side of the intermediate region; and a magnetically free region on an opposite side of the intermediate region, wherein the magnetically free region includes at least a first ferromagnetic region and a second ferromagnetic region separated by a non-magnetic insertion region, wherein each one of the first ferromagnetic region and the second ferromagnetic region includes at least a boron-rich ferromagnetic layer positioned proximate a boron-free ferromagnetic layer, and wherein one of the first ferromagnetic region and the second ferromagnetic region includes a boron-containing ferromagnetic layer and a ferromagnetic layer including iron or cobalt contacting each other, wherein the boron-rich ferromagnetic layer is in contact with the tunnel barrier of the intermediate region.

16. The magnetoresistive device of claim 15, wherein the boron-rich ferromagnetic layer includes an alloy consisting of (i) boron and (ii) only one of iron or cobalt, and wherein the boron-containing ferromagnetic layer includes an alloy consisting of (i) boron and (ii) at least one of iron or cobalt, wherein a boron composition in the boron-rich ferromagnetic layer is higher than a boron composition in the boron-containing ferromagnetic layer.

17. The magnetoresistive device of claim 15, wherein the boron-rich ferromagnetic layer is formed on the tunnel barrier of the intermediate region.

18. The magnetoresistive device of claim 15, wherein the boron-free ferromagnetic layer includes between approximately 4-80% atomic percent of cobalt, and wherein the boron-rich ferromagnetic layer includes between approximately 40-60% atomic percent of boron.

* * * * *